United States Patent
Lee et al.

(10) Patent No.: US 9,734,755 B2
(45) Date of Patent: Aug. 15, 2017

(54) TRANSPARENT DISPLAY PANEL AND TRANSPARENT ORGANIC LIGHT EMITTING DIODE DISPLAY DEVICE INCLUDING THE SAME

(71) Applicant: Samsung Display Co., Ltd., Yongin (KR)

(72) Inventors: Chang-Ho Lee, Seoul (KR); Gyung-Soon Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/800,005

(22) Filed: Jul. 15, 2015

(65) Prior Publication Data
US 2016/0055794 A1 Feb. 25, 2016

(30) Foreign Application Priority Data
Aug. 20, 2014 (KR) ........................ 10-2014-0108170

(51) Int. Cl.
*G09G 3/32* (2016.01)
*G09G 3/30* (2006.01)
(Continued)

(52) U.S. Cl.
CPC .............. *G09G 3/3208* (2013.01); *G09G 3/30* (2013.01); *G09G 3/3233* (2013.01);
(Continued)

(58) Field of Classification Search
CPC ......... G09G 3/3225; G09G 2300/0426; G09G 2320/0223; G09G 2320/043;
(Continued)

(56) References Cited

U.S. PATENT DOCUMENTS

2010/0123700 A1* 5/2010 Kim .................... G09G 3/3233
                                                        345/211
2010/0123707 A1* 5/2010 Miyazawa ............ G09G 3/325
                                                        345/211
(Continued)

FOREIGN PATENT DOCUMENTS

KR    10-2011-0085780       7/2011
KR    10-2012-0010824       2/2012
(Continued)

OTHER PUBLICATIONS

Extended European Search Report issued on Jan. 19, 2016, in European Patent Application No. 15166058.6.
(Continued)

*Primary Examiner* — Saiful A Siddiqui
(74) *Attorney, Agent, or Firm* — H.C. Park & Associates, PLC (57) ABSTRACT

A transparent display panel includes first through (N)-th vertical constant voltage lines (N is a natural number), first through (M)-th horizontal constant voltage line groups (M is a natural number), and a plurality of transparent pixels. The transparent pixels are disposed within a grid defined by the first through (N)-th vertical constant voltage lines and the first through (M)-th horizontal constant voltage line groups. The transparent pixels operate based on constant voltages transferred through the first through (N)-th vertical constant voltage lines and the first through (M)-th horizontal constant voltage line groups. The first through (N)-th vertical constant voltage lines include first vertical constant voltage lines and second vertical constant voltage lines. Each of the first through (M)-th horizontal constant voltage line groups includes a first horizontal constant voltage line and a second horizontal constant voltage line. The constant voltages
(Continued)

include a first constant voltage and a second constant voltage.

19 Claims, 5 Drawing Sheets

(51) Int. Cl.
    *G09G 3/3208*     (2016.01)
    *G09G 3/3233*     (2016.01)
    *G09G 3/3258*     (2016.01)
    *G09G 3/3266*     (2016.01)
    *G09G 3/3275*     (2016.01)
    *H01L 27/32*     (2006.01)

(52) U.S. Cl.
    CPC ......... *G09G 3/3258* (2013.01); *G09G 3/3266* (2013.01); *G09G 3/3275* (2013.01); *G09G 2300/0408* (2013.01); *G09G 2300/0426* (2013.01); *G09G 2300/0465* (2013.01); *G09G 2300/0819* (2013.01); *G09G 2300/0842* (2013.01); *G09G 2300/0861* (2013.01); *G09G 2320/0223* (2013.01); *G09G 2330/023* (2013.01); *G09G 2330/028* (2013.01); *H01L 27/326* (2013.01); *H01L 27/3276* (2013.01)

(58) Field of Classification Search
    CPC ....... G09G 2330/0242; G09G 2330/02; G09G 2330/06; G09G 5/00; G09G 2300/0866; G09G 2310/0251; G09G 2310/0262
See application file for complete search history.

(56) References Cited

U.S. PATENT DOCUMENTS

| | | |
|---|---|---|
| 2011/0102402 A1 | 5/2011 | Han |
| 2011/0128268 A1* | 6/2011 | Kim ..................... G09G 3/3225 345/211 |
| 2011/0175097 A1 | 7/2011 | Song et al. |
| 2011/0291115 A1* | 12/2011 | Kim ..................... G09G 3/3225 257/88 |
| 2012/0026144 A1 | 2/2012 | Kang et al. |
| 2012/0105412 A1 | 5/2012 | Kang et al. |
| 2012/0139819 A1* | 6/2012 | Tsai ..................... G09G 3/3225 345/76 |
| 2012/0139959 A1 | 6/2012 | Kim |
| 2012/0153321 A1 | 6/2012 | Chung et al. |
| 2012/0268696 A1* | 10/2012 | Yim ........................ G09G 3/32 349/104 |
| 2012/0293496 A1 | 11/2012 | Park et al. |
| 2014/0062331 A1 | 3/2014 | Nam et al. |
| 2014/0184579 A1 | 7/2014 | Kim et al. |

FOREIGN PATENT DOCUMENTS

| | | |
|---|---|---|
| KR | 10-2012-0044499 | 5/2012 |
| KR | 10-2012-0069312 | 6/2012 |

OTHER PUBLICATIONS

European Patent Office Action issued on Sep. 29, 2016, in European Patent Application No. 15166058.6.

* cited by examiner

TRANSPARENT DISPLAY PANEL AND TRANSPARENT ORGANIC LIGHT EMITTING DIODE DISPLAY DEVICE INCLUDING THE SAME

CROSS REFERENCE TO RELATED APPLICATION

This application claims priority from and the benefit of Korean Patent Application 10-2014-0108170, filed on Aug. 20, 2014, which is hereby incorporated by reference for all purposes as if fully set forth herein.

BACKGROUND

Field

Exemplary embodiments of the present invention relate to a display panel. More particularly, exemplary embodiments of the present invention relate to a transparent display panel and an organic light emitting diode (OLED) display device including the same.

Discussion of the Background

Since an organic light emitting diode (OLED) display device displays an image using an organic light emitting diode that generates light, the OLED display device may not include a light source (e.g., backlight unit), unlike a conventional liquid crystal display device. Thus, the OLED display device may be thin and light, compared with the conventional liquid crystal display device. In addition, the OLED display device may have advantages of low power consumption, improved luminance, improved response speed, among other advantages, when compared to the liquid crystal display device. Hence, the OLED display device is widely used as a display device included in various electronic devices.

A transparent OLED display device is a display device that shows an image displayed on a transparent display panel. The transparent display panel is included in the transparent OLED display device and provides a background for the transparent OLED display device. A transparent pixel includes a light emitting pixel circuit and a transmissive window.

Transmittance of the transparent display panel may be increased by enlarging area of the transmissive window compared to the area of the light emitting pixel circuit.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a transparent display panel having a high transmittance due to a reduction in the number of vertical constant voltage lines.

Exemplary embodiments of the present invention also provide an OLED display device including a transparent display panel having a high transmittance due to a reduction in the number of vertical constant voltage lines.

Additional aspects will be set forth in the detailed description which follows, and, in part, will be apparent from the disclosure, or may be learned by practice of the inventive concept.

An exemplary embodiment of the present invention discloses a transparent display panel including first through (N)-th vertical constant voltage lines (N is a natural number), first through (M)-th horizontal constant voltage line groups (M is a natural number), and a plurality of transparent pixels. The transparent pixels are disposed within a grid generated by the first through (N)-th vertical constant voltage lines and the first through (M)-th horizontal constant voltage line groups. The transparent pixels operate based on constant voltages transferred through the first through (N)-th vertical constant voltage lines and the first through (M)-th horizontal constant voltage line groups. The first through (N)-th vertical constant voltage lines include first vertical constant voltage lines and second vertical constant voltage lines. Each of the first through (M)-th horizontal constant voltage line groups includes a first horizontal constant voltage line and a second horizontal constant voltage line. The constant voltages include a first constant voltage and a second constant voltage. The first constant voltage is applied to the first vertical constant voltage lines. The first vertical constant voltage lines are electrically connected to the first horizontal constant voltage line included in each of the first through (M)-th horizontal constant voltage line groups. The second constant voltage is applied to the second vertical constant voltage lines. The second vertical constant voltage lines are electrically connected to the second horizontal constant voltage line included in each of the first through (M)-th horizontal constant voltage line groups. One of the first through (N)-th vertical constant voltage lines is disposed between horizontally neighboring two transparent pixels.

An exemplary embodiment of the present invention also discloses an light emitting diode (OLED) display device including a timing control circuit, a transparent display panel, a data driving unit, a scan driving unit, and a power control unit. The timing control circuit generates a data driving unit control signal and a scan driving unit control signal based on an input image data signal. The data driving unit generates data signals based on the data driving unit control signal, and provides the data signals to the transparent display panel through a plurality of data lines. The scan driving unit generates scan signals based on the scan driving unit control signal, and provides the scan signals to the transparent display panel through a plurality of scan lines. The power control unit provides constant voltages to the transparent display panel to operate the transparent display panel. The first through (N)-th vertical constant voltage lines include first vertical constant voltage lines and second vertical constant voltage lines. Each of the first through (M)-th horizontal constant voltage line groups includes a first horizontal constant voltage line and a second horizontal constant voltage line. The constant voltages include a first constant voltage and a second constant voltage. The first constant voltage is applied to the first vertical constant voltage lines. The first vertical constant voltage lines are electrically connected to the first horizontal constant voltage line included in each of the first through (M)-th horizontal constant voltage line groups. The second constant voltage is applied to the second vertical constant voltage lines. The second vertical constant voltage lines are electrically connected to the second horizontal constant voltage line included in each of the first through (M)-th horizontal constant voltage line groups. One of the first through (N)-th vertical constant voltage lines is disposed between horizontally neighboring two transparent pixels.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
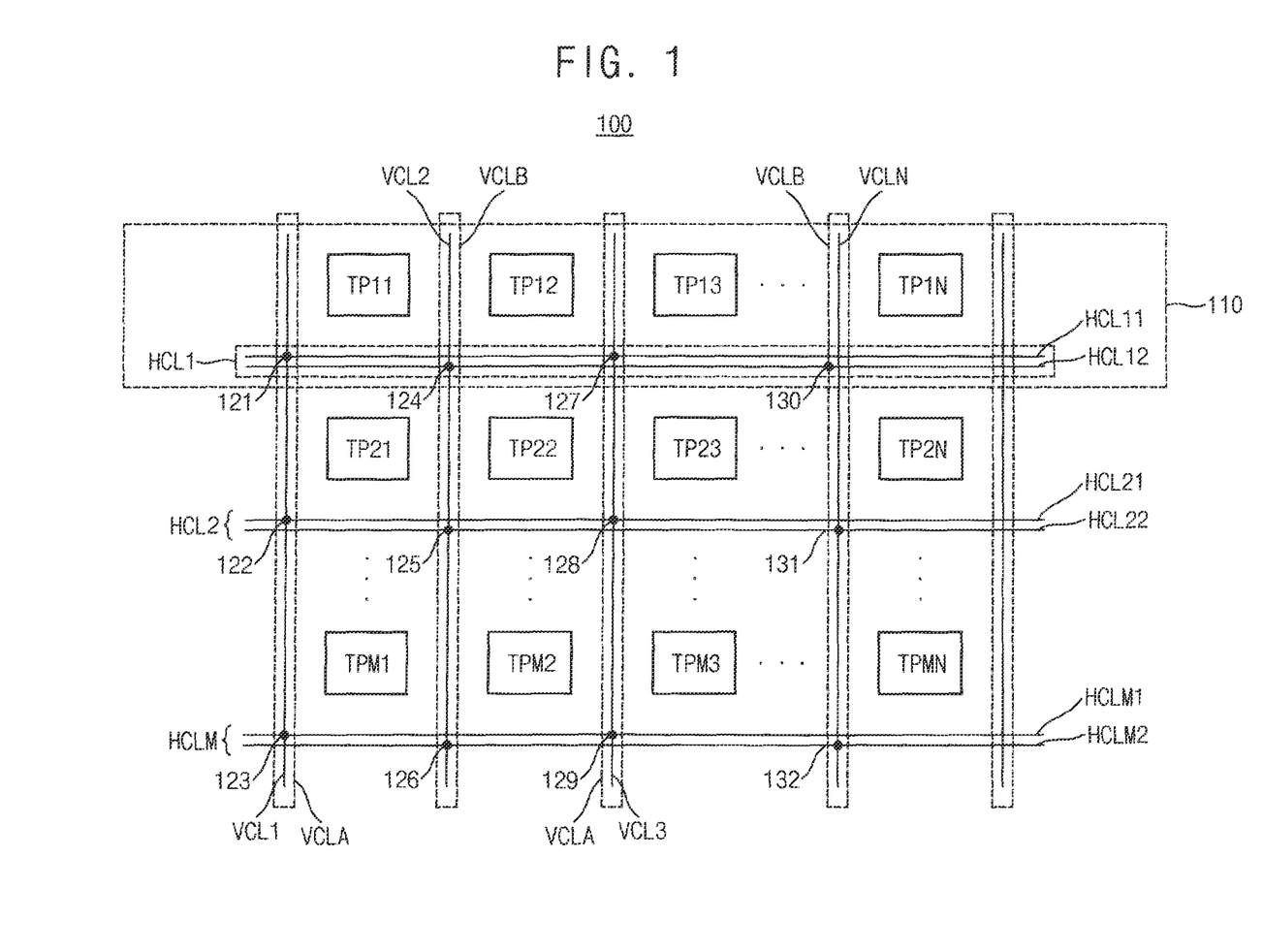
FIG. 1 is a block diagram illustrating a transparent display panel according to an exemplary embodiment of the present invention.

FIG. 1 is a block diagram illustrating a transparent display panel according to an exemplary embodiment of the present invention.

Referring to FIG. 1, a transparent display panel 100 includes first through (N)-th vertical constant voltage lines VCL1, VCL2, VCL3 through VCLN (N is a natural number), first through (M)-th horizontal constant voltage line groups HCL1, HCL2 through HCLM (M is a natural number), and a plurality of transparent pixels TP11 through TPMN.

The transparent display panel 100 includes first row transparent pixels 110. The first row transparent pixels 110 will be described with the reference to FIG. 2.

The transparent pixels TP11 through TPMN are disposed within grids generated by the first through (N)-th vertical constant voltage lines VCL1, VCL2, VCL3 through VCLN and the first through (M)-th horizontal constant voltage line groups HCL1, HCL2 through HCLM. The transparent pixels TP11 through TPMN are operated by constant voltages transferred through the first through (N)-th vertical constant voltage lines VCL1, VCL2, VCL3 through VCLN and the first through (M)-th horizontal constant voltage line groups HCL1, HCL2 through HCLM.

The first through (N)-th vertical constant voltage lines VCL1, VCL2, VCL3 through VCLN include first vertical constant voltage lines VCLA (in other words, VCL1 and VCL3 of FIG. 1) and second vertical constant voltage lines VCLB (in other words, VCL2 and VCLN of FIG. 1). Each of the first through (M)-th horizontal constant voltage line groups HCL1, HCL2 through HCLM includes a first horizontal constant voltage line and a second horizontal constant voltage line. However, aspects need not be limited thereto such that each of the first through (M)-th horizontal constant voltage line groups HCL1, HCL2 through HCLM may include more or fewer horizontal constant voltage lines; for example, each of the first through (M)-th horizontal constant voltage line groups HCL1, HCL2 through HCLM may include 3 or 4 or more horizontal constant voltage lines. Further, the horizontal constant voltage lines of each of the first through (M)-th horizontal constant voltage line groups HCL1, HCL2 through HCLM may be fastened or adhered together.

The first horizontal constant voltage line group HCL1 includes (1, 1) horizontal constant voltage line HCL11 and (1, 2) horizontal constant voltage line HCL12. The second horizontal constant voltage line group HCL2 includes (2, 1) horizontal constant voltage line HCL21 and (2, 2) horizontal constant voltage line HCL22. The (M)-th horizontal constant voltage line group HCLM includes (M, 1) horizontal constant voltage line HCLM1 and (M, 2) horizontal constant voltage line HCLM2.

The (K)-th vertical constant voltage line (K is a natural number less than N) may be disposed adjacent to the (K+1)-th vertical constant voltage line, and the (K)-th vertical constant voltage line may be disposed parallel to the (K+1)-th vertical constant voltage line. As an example, the first vertical constant voltage line VCL1 may be adjacent to the second vertical constant voltage line VCL2, and the first vertical constant voltage line VCL1 may be parallel to the second vertical constant voltage line VCL2. The second vertical constant voltage line VCL2 may be adjacent to the third vertical constant voltage line VCL3, and the second vertical constant voltage line VCL2 may be parallel to the third vertical constant voltage line VCL3. The third vertical constant voltage line VCL3 may be adjacent to the fourth vertical constant voltage line VCL4 (not shown), and the third vertical constant voltage line VCL3 may be parallel to the fourth vertical constant voltage line VCL4 (not shown). The (N−1)-th vertical constant voltage line may be adjacent to the (N)-th vertical constant voltage line VCLN, and the (N−1)-th vertical constant voltage line may be parallel to the (N)-th vertical constant voltage line VCLN.

The constant voltages include a first constant voltage and a second constant voltage. The first constant voltage is applied to the first vertical constant voltage lines VCLA. The first vertical constant voltage lines VCLA are electrically connected to the first horizontal constant voltage line included in each of the first through (M)-th horizontal constant voltage line groups HCL1, HCL2 through HCLM. The second constant voltage is applied to the second vertical constant voltage lines VCLB. The second vertical constant voltage lines VCLB are electrically connected to the second horizontal constant voltage line included in each of the first through (M)-th horizontal constant voltage line groups HCL1, HCL2 through HCLM.

FIG. 1 describes a first exemplary embodiment of the present invention in which N is an even natural number. In the first exemplary embodiment, the first vertical constant voltage lines VCLA may be odd-numbered vertical constant voltage lines among the first through (N)-th vertical constant voltage lines VCL1, VCL2, VCL3 through VCLN and the second vertical constant voltage lines VCLB may be even-numbered vertical constant voltage lines among the first through (N)-th vertical constant voltage lines VCL1, VCL2, VCL3 through VCLN.

The first vertical constant voltage line VCL1 may be electrically connected to the (1, 1) horizontal constant voltage line HCL11 at a first node 121. The first vertical constant voltage line VCL1 may be electrically connected to the (2, 1) horizontal constant voltage line HCL21 at a second node 122. The first vertical constant voltage line VCL1 may be electrically connected to the (M, 1) horizontal constant voltage line HCLM1 at a third node 123. The second vertical constant voltage line VCL2 may be electrically connected to the (1, 2) horizontal constant voltage line HCL12 at a fourth node 124. The second vertical constant voltage line VCL2 may be electrically connected to the (2, 2) horizontal constant voltage line HCL22 at a fifth node 125. The second vertical constant voltage line VCL2 may be electrically connected to the (M, 2) horizontal constant voltage line HCLM2 at a sixth node 126. The third vertical constant voltage line VCL3 may be electrically connected to the (1, 1) horizontal constant voltage line HCL11 at a seventh node 127. The third vertical constant voltage line VCL3 may be electrically connected to the (2, 1) horizontal constant voltage line HCL21 at an eighth node 128. The third vertical constant voltage line VCL3 may be electrically connected to the (M, 1) horizontal constant voltage line HCLM1 at a ninth node 129. The (N)-th vertical constant voltage line VCLN may be electrically connected to the (1, 2) horizontal constant voltage line HCL12 at a tenth node 130. The (N)-th vertical constant voltage line VCLN may be electrically connected to the (2, 2) horizontal constant voltage line HCL22 at an eleventh node 131. The (N)-th vertical constant voltage line VCLN may be electrically connected to the (M, 2) horizontal constant voltage line HCLM2 at a twelfth node 132.

One of the first through (N)-th vertical constant voltage lines VCL1, VCL2, VCL3 through VCLN may be disposed between two horizontally neighboring transparent pixels. As an example, the second vertical constant voltage line VCL2 is only disposed between horizontally neighboring first transparent pixel TP11 and the second transparent pixel TP12, and the third vertical constant voltage line VCL3 is only disposed between horizontally neighboring the second transparent pixel TP12 and the third transparent pixel TP13. The disclosed pattern may be extended based on the description above.

In an exemplary embodiment of the present invention, the first vertical constant voltage lines VCLA may be even-numbered vertical constant voltage lines, which are the second vertical constant voltage line VCL2 and the (N)-th vertical constant voltage line VCLN, among the first through (N)-th vertical constant voltage lines VCL1, VCL2, VCL3 through VCLN. In this case, the second vertical constant voltage lines VCLB may be odd-numbered vertical constant voltage lines, which are the first vertical constant voltage line VCL1 and the third vertical constant voltage line VCL3, among the first through (N)-th vertical constant voltage lines VCL1, VCL2, VCL3 through VCLN. The disclosed pattern may be extended based on the description above.

In an exemplary embodiment of the present invention, the first vertical constant voltage lines VCLA may be (P*L)-th vertical constant voltage lines (P are natural numbers, N is a multiple of 3, and L is 3), which are the third vertical constant voltage line VCL3 and the (N)-th vertical constant voltage line VCLN. In this case, the second vertical constant voltage lines VCLB may be the first through (N)-th vertical constant voltage lines VCL1, VCL2, VCL3 through VCLN except the first vertical constant voltage lines VCLA, which are the first vertical constant voltage line VCL1 and the second vertical constant voltage line VCL2. The disclosed pattern may be extended based on the description above.

In an exemplary embodiment of the present invention, the second vertical constant voltage lines VCLB may be (P*L)-th vertical constant voltage lines (P are natural numbers, N is a multiple of 3, and L is 3), which are the third vertical constant voltage line VCL3 and the (N)-th vertical constant voltage line VCLN. In this case, the first vertical constant voltage lines VCLA may be the first through (N)-th vertical constant voltage lines VCL1, VCL2, VCL3 through VCLN except the second vertical constant voltage lines VCLB, which are the first vertical constant voltage line VCL1 and the second vertical constant voltage line VCL2. The disclosed pattern may be extended based on the description above.

Figure 2:
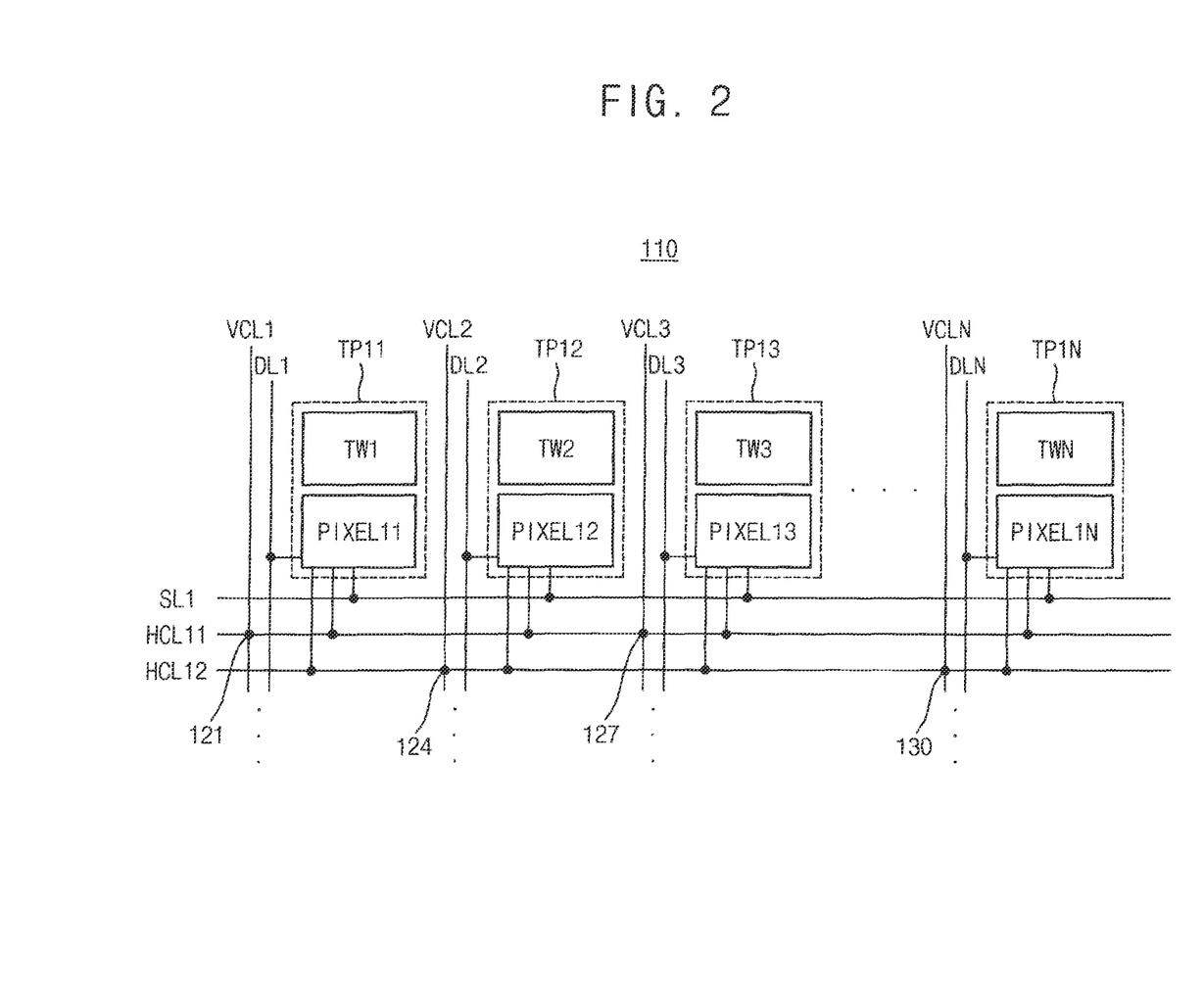
FIG. 2 is a block diagram illustrating the first row transparent pixels included in the transparent display panel of FIG. 1.

FIG. 2 is a block diagram illustrating the first row transparent pixels included in the transparent display panel of FIG. 1.

Referring to FIG. 2, the first transparent pixel TP11 includes a first transmissive window TW1 and a first light emitting pixel circuit PIXEL11. The second transparent pixel TP12 includes a second transmissive window TW2 and a second light emitting pixel circuit PIXEL12. The third transparent pixel TP13 includes a third transmissive window TW3 and a third light emitting pixel circuit PIXEL13. The (N)-th transparent pixel TP1N includes a (N)-th transmissive window TWN and a (N)-th light emitting pixel circuit PIXEL1N.

The transparent display panel 100 of FIG. 1 may further include a plurality of data lines DL1, DL2, DL3 through DLN, which are disposed parallel to the first through (N)-th vertical constant voltage lines VCL1, VCL2, VCL3 through VCLN. Each of the plurality of the data lines DL1, DL2, DL3 through DLN may be disposed adjacent to each of the first through (N)-th vertical constant voltage lines VCL1, VCL2, VCL3 through VCLN. In detail, the first data line DL1 may be disposed adjacent to the first vertical constant voltage line VCL1 and the first data line DL1 may be disposed parallel to the first vertical constant voltage line VCL1. The second data line DL2 may be disposed adjacent to the second vertical constant voltage line VCL2 and the second data line DL2 may be disposed parallel to the second vertical constant voltage line VCL2. The third data line DL3 may be disposed adjacent to the third vertical constant voltage line VCL3 and the third data line DL3 may be disposed parallel to the third vertical constant voltage line VCL3. The (N)-th data line DLN may be disposed adjacent to the (N)-th vertical constant voltage line VCLN and the (N)-th data line DLN may be disposed parallel to the (N)-th vertical constant voltage line VCLN.

The transparent display panel 100 of FIG. 1 may further include a plurality of scan lines SL1, which are disposed parallel to the first through (M)-th horizontal constant voltage line groups HCL1, HCL2 through HCLM. Each of the plurality of scan lines SL1 may be disposed adjacent to the first or second horizontal constant voltage line included in each of the first through (M)-th horizontal constant voltage line groups HCL1, HCL2 through HCLM. That is, the first scan line SL1 may be disposed adjacent to the (1, 1) horizontal constant voltage line HCL11 included in the first horizontal constant voltage line group HCL1, and the first scan line SL1 may be disposed parallel to the (1, 1) horizontal constant voltage line HCL11.

The first row transparent pixels 110 may be operated by data signals transferred through the data lines DL1, DL2, DL3 through DLN and scan signals transferred through the scan lines SL1. The first transparent pixel TP11 may be operated by the first data signal transferred through the first data line DL1 and the first scan signal transferred through the first scan line SL1. The second transparent pixel TP12 may be operated by the second data signal transferred through the second data line DL2 and the first scan signal transferred through the first scan line SL1. The third transparent pixel TP13 may be operated by the third data signal transferred through the third data line DL3 and the first scan signal transferred through the first scan line SL1. The (N)-th transparent pixel TP1N may operate based on the (N)-th data signal transferred through the (N)-th data line DLN and the first scan signal transferred through the first scan line SL1. Other transparent pixels included in the transparent display panel 100 of FIG. 1 may operate in a similar pattern based on the description of the first row transparent pixels 110.

Figure 3:
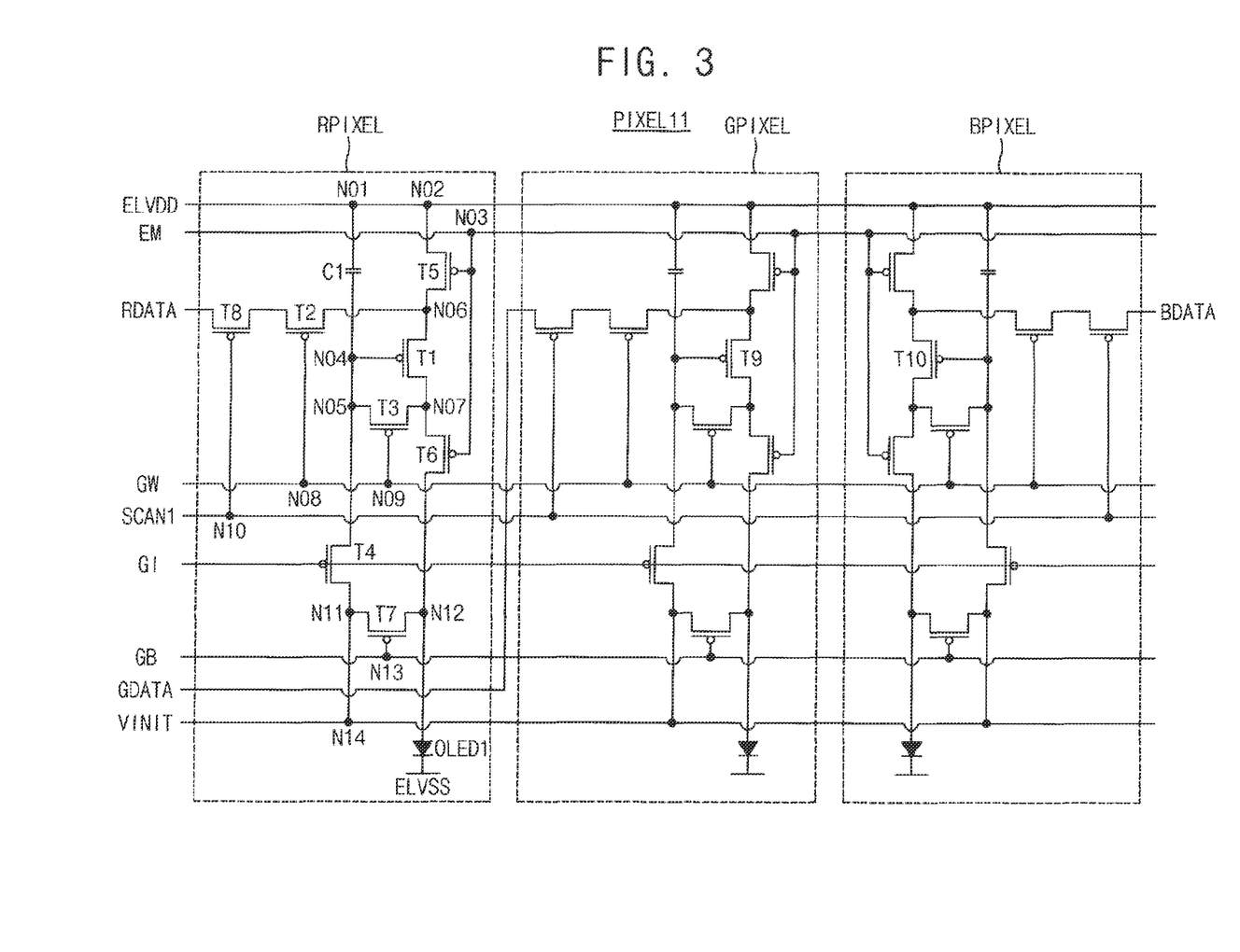
FIG. 3 is a block diagram illustrating the first light emitting pixel circuit included in first row of transparent pixels of FIG. 2.

FIG. 3 is a block diagram illustrating the first light emitting pixel circuit included in the first row transparent pixels of FIG. 2.

Referring to FIG. 3, the first light emitting pixel circuit PIXEL11 of the first row transparent pixels 110 of FIG. 2 may include a red (R) light emitting sub pixel circuit (RPIXEL), a green (G) light emitting sub pixel circuit (GPIXEL), and a blue (B) light emitting sub pixel circuit (BPIXEL).

The first constant voltage of the transparent display panel 100 of FIG. 1 may be a supply voltage ELVDD. The second constant voltage of the transparent display panel 100 of FIG. 1 may be an initialization voltage VINIT.

The initialization voltage VINIT may be used to compensate for a difference between threshold voltages of driving transistors T1, T9, and T10 included in the first light emitting pixel circuit PIXEL11. The procedure of compensating for the difference between the threshold voltages of the driving transistors T1, T9, and T10 is obvious to an ordinary-skilled person in the art and will not be described here.

The R light emitting sub pixel circuit RPIXEL includes a plurality of transistors T1 through T8, a first capacitor C1, and a first organic light emitting diode OLED1. Each of the transistors T1 through T8 may be a p-type metal oxide semiconductor (pMOS) transistor.

A terminal of the first capacitor C1 is electrically connected to a first node N01 and another terminal of the first capacitor C1 is electrically connected to a fourth node N04. The supply voltage ELVDD is applied to the first node N01.

A drain terminal of the fifth transistor T5 is electrically connected to a second node N02, a gate terminal of the fifth transistor T5 is electrically connected to a third node N03, and a source terminal of fifth transistor T5 is electrically connected to the sixth node N06. The supply voltage ELVDD is applied to the second node N02. An enable signal EM is applied to the third node N03. A drain terminal of the eighth transistor T8 receives R data signal RDATA, a gate terminal of the eighth transistor T8 is electrically connected to a tenth node N10, and a source terminal of the eighth transistor T8 is electrically connected to a drain terminal of the second transistor T2. The first scan signal SCANT is applied to the tenth node N10. The drain terminal of the second transistor T2 is electrically connected to the source terminal of the eighth transistor T8, a gate terminal of the second transistor T2 is electrically connected to an eighth node N08, and a source terminal of the second transistor T2 is electrically connected to the sixth node N06. A compensation signal GW is applied to the eighth node N08. A drain terminal of the first transistor T1 is electrically connected to the sixth node N06, a gate terminal of the first transistor T1 is electrically connected to the fourth node N04, and a source terminal of the first transistor T1 is electrically connected to a seventh node N07. The fourth node N04 and a fifth node N05 are electrically connected each other. A drain terminal of the third transistor T3 is electrically connected to the fifth node N05, a gate terminal of the third transistor T3 is electrically connected to a ninth node N09, and a source terminal of the third transistor T3 is electrically connected to the seventh node N07. The compensation signal GW is applied to the ninth node N09. A drain terminal of the sixth transistor T6 is electrically connected to the seventh node N07, a gate terminal of the sixth transistor T6 is electrically connected the third node N03, and a source terminal of the sixth transistor T6 is electrically connected to a twelfth node N12. A drain terminal of the fourth transistor T4 is electrically connected to the fifth node N05, a gate terminal of the fourth transistor T4 receives an initialization signal GI, and a source terminal of the fourth transistor T4 is electrically connected to an eleventh node N11. The eleventh node N11 is electrically connected to the fourteenth node N14. The initialization voltage VINIT is applied to the fourteenth node N14. A drain terminal of the seventh transistor T7 is electrically connected to the eleventh node N11, a gate terminal of the seventh transistor T7 is electrically connected to the thirteenth node N13, and a source terminal of the seventh transistor T7 is electrically connected to the twelfth node N12. A discharge signal GB is applied to the thirteenth node N13. A terminal of the first organic light emitting diode OLED1 is electrically connected to the twelfth node N12 and another terminal of the first organic light emitting diode OLED1 receives the ground voltage ELVSS.

The G light emitting sub pixel circuit GPIXEL and the B light emitting sub pixel circuit BPIXEL may be arranged similarly to R light emitting sub pixel circuit RPIXEL. Thus, in depth descriptions of the arrangements of G light emitting sub pixel circuit GPIXEL and the B light emitting sub pixel circuit BPIXEL will be omitted.

Figure 4:
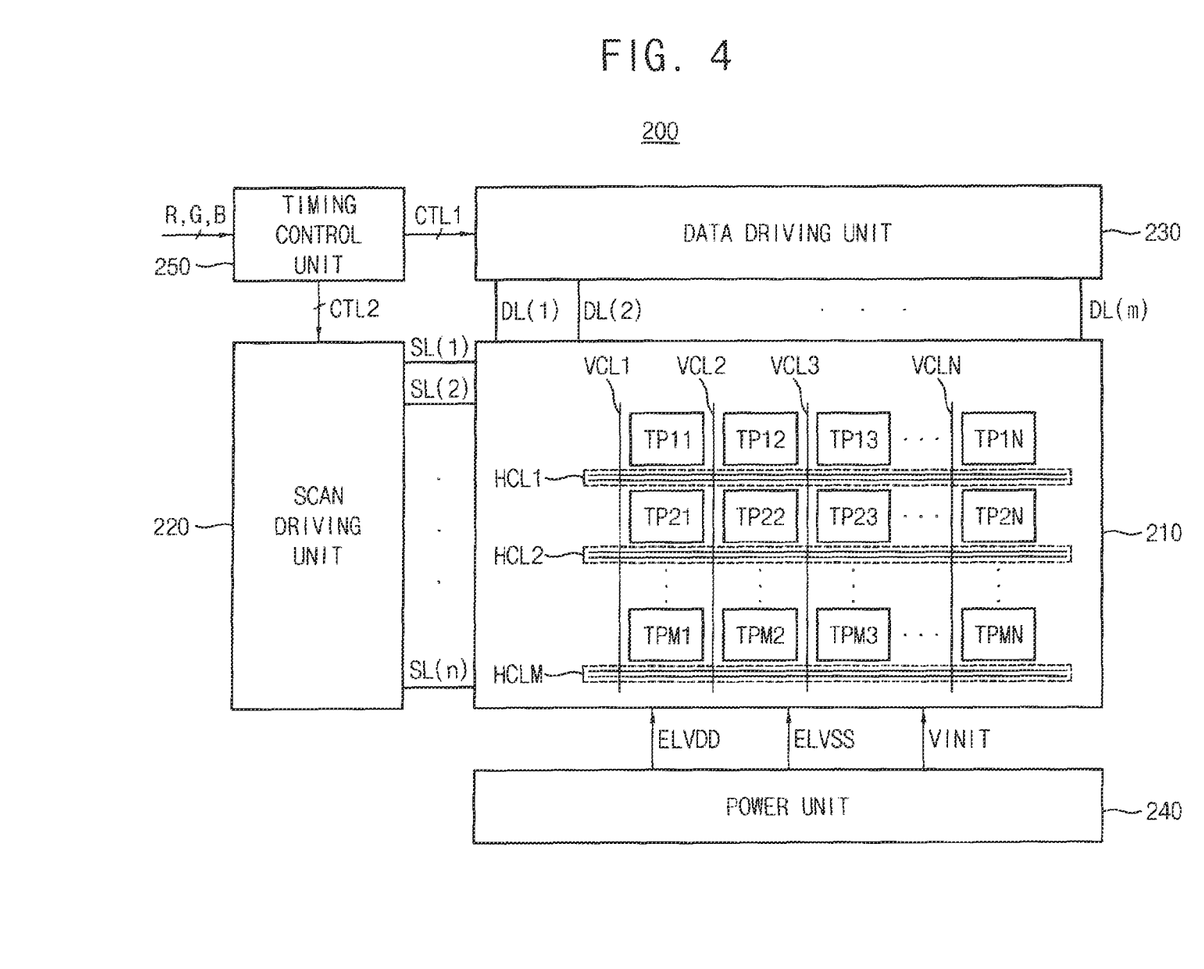
FIG. 4 is a block diagram illustrating a transparent OLED display device according to an exemplary embodiment of the present invention.

FIG. 4 is a block diagram illustrating a transparent OLED display device according to an exemplary embodiment of the present invention.

Referring to FIG. 4, a transparent light emitting diode (OLED) display device 200 includes a timing control circuit 250, a transparent display panel 210, a data driving unit 230, a scan driving unit 220, and a power control unit 240.

The timing control circuit 250 generates a data driving unit control signal CTL1 and a scan driving unit control signal CTL2 based on an input image data signal (R, G, B). The data driving unit 230 generates data signals based on the data driving unit control signal CTL1, and provides the data signals to the transparent display panel 210 through a plurality of data lines DL(1), DL(2) through DL(M). The scan driving unit 220 generates scan signals based on the scan driving unit control signal CTL2, and provides the scan signals to the transparent display panel 210 through a plurality of scan lines SL(1), SL(2) through SL(N). The power control unit 240 provides constant voltages to the transparent display panel 210 to operate the transparent display panel 210. The constant voltages may include the supply voltage ELVDD, the ground voltage ELVSS, and the initialization voltage VINIT. The transparent display panel 210 includes first through (N)-th vertical constant voltage lines VCL1, VCL2, VCL3 through VCLN (N is a natural number), first through (M)-th horizontal constant voltage line groups HCL1, HCL2 through HCLM, and a plurality of transparent pixels TP11 through TPMN. The transparent pixels TP11 through TPMN are disposed within a grid generated by the first through (N)-th vertical constant voltage lines VCL1, VCL2, VCL3 through VCLN and the first through (M)-th horizontal constant voltage line groups HCL1, HCL2 through HCLM. The transparent pixels TP11 through TPMN are operated by the constant voltages transferred through the first through (N)-th vertical constant voltage lines VCL1, VCL2, VCL3 through VCLN and the first through (M)-th horizontal constant voltage line groups HCL1, HCL2 through HCLM.

The transparent display panel 210 may be understood based on the references to FIGS. 1 through 3.

Figure 5:
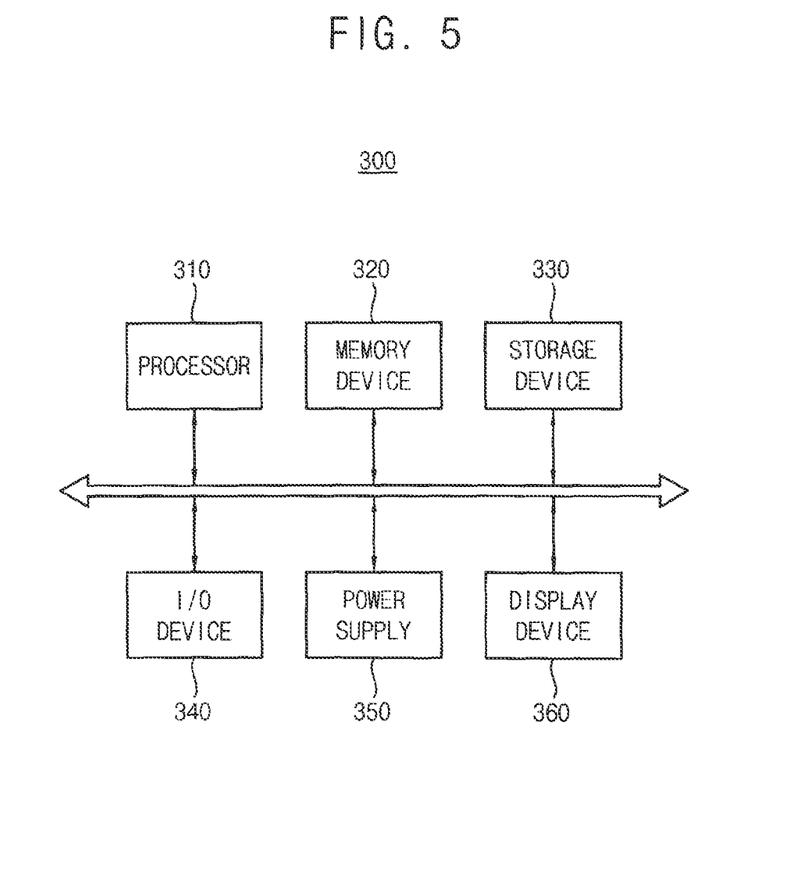
FIG. 5 is a block diagram illustrating an electronic device including a transparent OLED display device according to an exemplary embodiment of the present invention.

FIG. 5 is a block diagram illustrating an electronic device including a transparent OLED display device according to an exemplary embodiment of the present invention.

Referring to FIG. 5, an electronic device 300 may include a processor 310, a memory device 320, a storage device 330, an input/output (I/O) device 340, a power supply 350, and a display device 360. Here, the electronic device 300 may further include a plurality of communication ports to connect a video card, a sound card, a memory card, a universal serial bus (USB) device, and/or other electronic devices. Although the electronic device 300 is implemented as a smartphone, a kind of the electronic device 300 is not limited thereto.

The processor 310 may perform various computing operations. The processor 310 may be a micro processor, a central processing unit (CPU), etc. The processor 310 may be coupled to other components via an address bus, a control bus, a data bus, etc. Further, the processor 310 may be coupled to an extended bus such as a peripheral component interconnection (PCI) bus.

The memory device 320 may store data for operation of the electronic device 300. For example, the memory device 320 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc.

The storage device 330 may be a solid state drive (SSD) device, a hard disk drive (HDD) device, a CD-ROM device, etc. The I/O device 340 may be an input device such as a keyboard, a keypad, a touchpad, a touch-screen, a mouse, etc., and/or an output device such as a printer, a speaker, etc. The power supply 350 may provide power for the operation of the electronic device 300. The display device 360 may communicate with other components via the buses or other communication links.

The display device 360 may be the transparent display device 200 of FIG. 4. The display device 360 may be understood based on the references to FIGS. 1 through 4.

The exemplary embodiments of the present invention may be applied to any electronic system 300 having the display device 360. For example, the exemplary embodiments of the present invention may be applied to the electronic system 300, such as a digital or 3D television, a computer monitor, a home appliance, a laptop computer, a digital camera, a cellular phone, a smartphone, a personal digital assistant (PDA), a portable multimedia player (PMP), an MP3 player, a portable game console, a navigation system, a video phone, etc. Exemplary embodiments of present invention may be applied to a transparent OLED display device and an electronic device including the same. For example, the invention may be applied to a monitor, a television, a computer, a laptop computer, a digital camera, a mobile phone, a smartphone, a smart pad, a PDA, a PMP, a MP3 player, a navigation system, and/or a camcorder.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A transparent display panel, comprising:
   first through (N)-th vertical constant voltage lines (N is a natural number);
   first through (M)-th horizontal constant voltage line groups (M is a natural number); and
   transparent pixels disposed within a grid defined by the first through (N)-th vertical constant voltage lines and the first through (M)-th horizontal constant voltage line groups, the transparent pixels configured to be operated by constant voltages transferred through the first through (N)-th vertical constant voltage lines and the first through (M)-th horizontal constant voltage line groups,
   wherein each of the transparent pixels comprises a transmissive window and a plurality of sub pixel circuits that are arranged in a horizontal row and vertically adjacent to the transmissive window,
   wherein the first through (N)-th vertical constant voltage lines comprise first vertical constant voltage lines and second vertical constant voltage lines,
   wherein each of the first through (M)-th horizontal constant voltage line groups comprises a first horizontal constant voltage line and a second horizontal constant voltage line,
   wherein the constant voltages comprise a first constant voltage and a second constant voltage,
   wherein the first vertical constant voltage lines are configured to receive the first constant voltage, and the first vertical constant voltage lines are electrically connected to the first horizontal constant voltage line disposed in each of the first through (M)-th horizontal constant voltage line groups,
   wherein the second vertical constant voltage lines are configured to receive the second constant voltage, and the second vertical constant voltage lines are electrically connected to the second horizontal constant voltage line disposed in each of the first through (M)-th horizontal constant voltage line groups,
   wherein each of the sub pixel circuits is electrically connected to the first horizontal constant voltage line and the second horizontal constant voltage line included in one of the first through (M)-th horizontal constant voltage line groups and receives the first constant voltage and the second constant voltage,
   wherein each of the first through (N)-th vertical constant voltage lines is disposed between transmissive windows in two horizontally neighboring transparent pixels, and
   wherein, for each of the first through (M)-th horizontal constant voltage line groups, the first horizontal constant voltage line and the second horizontal constant voltage line are disposed between two vertically neighboring transparent pixels.

2. The transparent display panel of claim 1, wherein the first constant voltage is a supply voltage and the second constant voltage is an initialization voltage.

3. The transparent display panel of claim 2, wherein the initialization voltage is configured to compensate a difference between threshold voltages of driving transistors disposed in the transparent pixels.

4. The transparent display panel of claim 1, wherein the (K)-th vertical constant voltage line (K is a natural number less than N) is disposed adjacent to the (K+1)-th vertical constant voltage line, and the (K)-th vertical constant voltage line is disposed parallel to the (K+1)-th vertical constant voltage line.

5. The transparent display panel of claim 4, wherein the first vertical constant voltage lines are odd-numbered vertical constant voltage lines among the first through (N)-th vertical constant voltage lines, and the second vertical constant voltage lines are even-numbered vertical constant voltage lines among the first through (N)-th vertical constant voltage lines.

6. The transparent display panel of claim 4, wherein the first vertical constant voltage lines are even-numbered vertical constant voltage lines among the first through (N)-th vertical constant voltage lines, and the second vertical constant voltage lines are odd-numbered vertical constant voltage lines among the first through (N)-th vertical constant voltage lines.

7. The transparent display panel of claim 4, wherein the first vertical constant voltage lines are (P*L)-th vertical constant voltage lines (P are natural numbers, L is a natural number less than or equal to N), and the second vertical constant voltage lines are the first through (N)-th vertical constant voltage lines except the first vertical constant voltage lines.

8. The transparent display panel of claim 4, wherein the second vertical constant voltage lines are (P*L)-th vertical constant voltage lines (P are natural numbers, L is a natural number less than or equal to N), and the first vertical constant voltage lines are the first through (N)-th vertical constant voltage lines except the second vertical constant voltage lines.

9. The transparent display panel of claim 1, wherein the transparent display panel further comprises data lines disposed parallel and adjacent to the first through (N)-th vertical constant voltage lines.

10. The transparent display panel of claim 9, wherein the transparent display panel further comprises scan lines which are disposed parallel to the first through (M)-th horizontal constant voltage line groups, each scan line disposed adjacent to the first or second horizontal constant voltage line disposed in each of the first through (M)-th horizontal constant voltage line groups.

11. The transparent display panel of claim 10, wherein the transparent pixels are configured to be operated by data signals transferred through the data lines and scan signals transferred through the scan lines.

12. The transparent display panel of claim 1, wherein the sub pixel circuits comprise a red light emitting sub pixel circuit, a green light emitting sub pixel circuit, and a blue light emitting sub pixel circuit.

13. An organic light emitting diode (OLED) display device, comprising:
a timing control circuit configured to generate a data driving unit control signal and a scan driving unit control signal based on an input image data signal;
a transparent display panel;
a data driving unit configured to generate data signals based on the data driving unit control signal, and provide the data signals to the transparent display panel through data lines;
a scan driving unit configured to generate scan signals based on the scan driving unit control signal, and provide the scan signals to the transparent display panel through scan lines; and
a power control unit configured to provide constant voltages to the transparent display panel,
wherein the transparent display panel comprises:
first through (N)-th vertical constant voltage lines (N is a natural number);
first through (M)-th horizontal constant voltage line groups (M is a natural number); and
transparent pixels disposed within a grid defined by the first through (N)-th vertical constant voltage lines and the first through (M)-th horizontal constant voltage line groups, the transparent pixels configured to be operated by constant voltages transferred through the first through (N)-th vertical constant voltage lines and the first through (M)-th horizontal constant voltage line groups,
wherein each of the transparent pixels comprises a transmissive window and a plurality of sub pixel circuits that are arranged in a horizontal row and vertically adjacent to the transmissive window,
wherein the first through (N)-th vertical constant voltage lines comprise first vertical constant voltage lines and second vertical constant voltage lines,
wherein each of the first through (M)-th horizontal constant voltage line groups comprise a first horizontal constant voltage line and a second horizontal constant voltage line,
wherein the constant voltages comprise a first constant voltage and a second constant voltage,
wherein the first vertical constant voltage lines are configured to receive the first constant voltage, and the first vertical constant voltage lines are electrically connected to the first horizontal constant voltage line disposed in each of the first through (M)-th horizontal constant voltage line groups,
wherein the second vertical constant voltage lines are configured to receive the second constant voltage, and the second vertical constant voltage lines are electrically connected to the second horizontal constant voltage line disposed in each of the first through (M)-th horizontal constant voltage line groups,
wherein each of the sub pixel circuits is electrically connected to the first horizontal constant voltage line and the second horizontal constant voltage line included in one of the first through (M)-th horizontal constant voltage line groups and receives the first constant voltage and the second constant voltage,
wherein each of the first through (N)-th vertical constant voltage lines is disposed between transmissive windows in two horizontally neighboring transparent pixels, and
wherein, for each of the first through (M)-th horizontal constant voltage line groups, the first horizontal constant voltage line and the second horizontal constant voltage line are disposed between two vertically neighboring transparent pixels.

14. The OLED display device of claim 13, wherein the first constant voltage is a supply voltage and the second constant voltage is an initialization voltage.

15. The OLED display device of claim 13, wherein the (K)-th vertical constant voltage line (K is a natural number less than N) is disposed adjacent and parallel to the (K+1)-th vertical constant voltage line.

16. The OLED display device of claim 15, wherein the first vertical constant voltage lines are odd-numbered vertical constant voltage lines among the first through (N)-th vertical constant voltage lines, and the second vertical constant voltage lines are even-numbered vertical constant voltage lines among the first through (N)-th vertical constant voltage lines.

17. The OLED display device of claim 15, wherein the first vertical constant voltage lines are even-numbered vertical constant voltage lines among the first through (N)-th vertical constant voltage lines, and the second vertical constant voltage lines are odd-numbered vertical constant voltage lines among the first through (N)-th vertical constant voltage lines.

18. The OLED display device of claim 15, wherein the first vertical constant voltage lines are (P*L)-th vertical constant voltage lines (P are natural numbers, L is a natural number less than or equal to N), and the second vertical constant voltage lines are the first through (N)-th vertical constant voltage lines except the first vertical constant voltage lines.

19. The OLED display device of claim 15, wherein the second vertical constant voltage lines are (P*L)-th vertical constant voltage lines (P are natural numbers, L is a natural number less than or equal to N), and the first vertical constant voltage lines are the first through (N)-th vertical constant voltage lines except the second vertical constant voltage lines.

* * * * *